United States Patent
Orimoto et al.

(10) Patent No.: US 7,446,369 B2
(45) Date of Patent: Nov. 4, 2008

(54) SONOS MEMORY CELL HAVING HIGH-K DIELECTRIC

(75) Inventors: Takashi Whitney Orimoto, Mountain View, CA (US); Joong Jeon, Cupertino, CA (US); Hidehiko Shiraiwa, San Jose, CA (US); Simon S. Chan, Saratoga, CA (US); Harpreet K. Sachar, Milpitas, CA (US)

(73) Assignees: Spansion, LLC, Sunnyvale, CA (US); Advnaced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/196,434

(22) Filed: Aug. 4, 2005

(65) Prior Publication Data

US 2007/0029601 A1 Feb. 8, 2007

(51) Int. Cl.
*H01L 29/788* (2006.01)

(52) U.S. Cl. .................. 257/315; 257/317; 257/321; 257/324; 257/E29.129; 257/E29.3; 257/E29.304

(58) Field of Classification Search ............ 438/3; 257/316, 315, 317, 321, 324, 325, E27.104, 257/E29.129, E29.3, E29.304, E29.309
See application file for complete search history.

(56) References Cited

U.S. PATENT DOCUMENTS

| | | | |
|---|---|---|---|
| 4,994,403 A * | 2/1991 | Gill | 438/261 |
| 5,914,895 A * | 6/1999 | Jenne | 365/185.08 |
| 6,163,049 A | 12/2000 | Bui | 257/321 |
| 6,215,702 B1 | 4/2001 | Derhacobian et al. | 365/185.29 |
| 6,407,435 B1 | 6/2002 | Ma et al. | |
| 6,445,030 B1 * | 9/2002 | Wu et al. | 257/315 |
| 6,559,014 B1 | 5/2003 | Jeon | |
| 6,562,491 B1 | 5/2003 | Jeon | |
| 6,617,639 B1 * | 9/2003 | Wang et al. | 257/324 |
| 6,642,573 B1 * | 11/2003 | Halliyal et al. | 257/316 |
| 6,674,138 B1 * | 1/2004 | Halliyal et al. | 257/411 |
| 6,693,004 B1 | 2/2004 | Halliyal et al. | 438/240 |
| 6,744,675 B1 | 6/2004 | Zheng et al. | 365/185.28 |
| 6,750,066 B1 | 6/2004 | Cheung et al. | 438/3 |
| 6,753,570 B1 | 6/2004 | Tripsas et al. | |
| 6,760,270 B2 | 7/2004 | Chindalore et al. | 365/218 |
| 6,768,160 B1 | 7/2004 | Li et al. | 257/315 |
| 6,797,599 B2 | 9/2004 | Visokay et al. | |
| 6,812,517 B2 | 11/2004 | Baker | 257/315 |
| 6,894,932 B1 | 5/2005 | Melik-Martirosian et al. | 365/185.28 |

(Continued)

FOREIGN PATENT DOCUMENTS

DE 29 46 864 A1 6/1980

OTHER PUBLICATIONS

Co-pending U.S. Appl. No. 11/008,233, filed Dec. 10, 2004; entitled: "Memory Cell Having Enhanced High-K Dielectric", by Joong Jeon et al., 30 pages.

(Continued)

*Primary Examiner*—Minh-Loan Tran
*Assistant Examiner*—Benjamin Tzu-Hung Liu
(74) *Attorney, Agent, or Firm*—Harrity & Harrity, LLP (57) ABSTRACT

A semiconductor memory device may include an intergate dielectric layer of a high-K dielectric material interposed between a floating gate and a control gate. With this intergate high-K dielectric in place, the memory device may be erased using Fowler-Nordheim tunneling.

10 Claims, 10 Drawing Sheets

U.S. PATENT DOCUMENTS

| | | |
|---|---|---|
| 7,034,356 B2 | 4/2006 | Nomoto et al. |
| 7,071,538 B1* | 7/2006 | Shiraiwa et al. ............ 257/635 |
| 2002/0024092 A1 | 2/2002 | Palm et al. |
| 2003/0045082 A1 | 3/2003 | Eldridge et al. ............ 438/593 |
| 2003/0062567 A1* | 4/2003 | Zheng et al. ................ 257/316 |
| 2003/0122204 A1 | 7/2003 | Nomoto et al. ............ 257/406 |
| 2004/0028952 A1 | 2/2004 | Cartier et al. |
| 2004/0041192 A1* | 3/2004 | Baker ........................ 257/304 |
| 2005/0006696 A1 | 1/2005 | Noguchi et al. ............ 257/316 |
| 2005/0036391 A1* | 2/2005 | Tomiie et al. .............. 365/232 |
| 2006/0160303 A1 | 7/2006 | Ang et al. |

OTHER PUBLICATIONS

Co-pending U.S. Appl. No. 11/049,855, filed Feb. 4, 2005; entitled: "Non-Volatile Memory Device With Improved Erase Speed", by Joong Jeon et al., 22 pages.

Co-pending U.S. Appl. No. 11/086,310, filed Mar. 23, 2005; entitled: "High K Stack For Non-Volatile Memory", by Wei Zheng et al., 21 pages.

Co-pending U.S. Appl. No. 11/128,392, filed May 13, 2005; entitled: "SONOS Memory Cell Having a Graded High-K Dielectric", by Takashi Whitney Orimoto et al., 31 pages.

International Search Report for PCT/US2006/028813 Mailed Dec. 6, 2006, 3 pages.

* cited by examiner

SONOS MEMORY CELL HAVING HIGH-K DIELECTRIC

TECHNICAL FIELD

Techniques described herein relate generally to non-volatile memory (NVM), and more specifically, to non-volatile memory devices having a silicon-oxide-nitride-oxide-silicon (SONOS) structure.

BACKGROUND ART

Conventional semiconductor memory devices may use a memory structure characterized by a vertical stack of a tunnel oxide ($SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and a source and drain on opposing sides of the channel region.

One particular type of memory cell structure is characterized by a vertical stack that includes an insulating oxide tunnel layer, a charge trapping nitride dielectric layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

The SONOS memory cell may be programmed by a hot electron injection process that injects electrons from the channel region to the nitride layer to create a non-volatile negative charge within the nitride layer. The electron injection may be performed by applying a drain-to-source bias along with a high positive voltage on the control gate. The high voltage on the control gate inverts the channel region while the drain-to-source bias accelerates electrons towards the drain region. The electrons are generally accelerated towards the drain region, with some of the electrons being re-directed towards the bottom oxide layer. The accelerated electrons gain enough kinetic energy to cross the bottom oxide layer and enter the nitride layer. The nitride layer stores the injected electrons within traps and thus acts as a charge storing layer.

Once programmed, the charged nitride layer becomes a floating gate for the memory cell. The negatively charged floating gate causes the threshold voltage of the memory cell to increase, which changes the magnitude of the current flowing between the source and the drain at various control gate voltages. Reading the programmed, or non-programmed, state of the memory cell is based on the magnitude of the current flowing between the source and drain at a predetermined control gate voltage.

The programmed SONOS memory cell may eventually need to be erased. A typical erase mechanism is hot hole injection (HHI). In HHI, a negative voltage may be placed on the control gate and the source-to-well and drain-to-well interfaces may be reverse biased. The reverse bias generates hot holes that are attracted to the floating gate by the negative voltage applied to the control gate. This causes a net positive charge in the floating gate and reduces the threshold voltage of the device.

One potential problem associated with erasing the memory cell using HHI is that this process tends to damage the bottom oxide layer. Thus, it would be desirable to provide an improved structure that eliminates this problem.

SUMMARY OF THE INVENTION

One aspect is directed to a memory device that includes a gate dielectric formed on a substrate, a floating gate formed on the gate dielectric, an intergate dielectric formed on the floating gate and including a high-K material, and a control gate formed above the intergate dielectric. The memory device additionally includes a programming circuit configured to erase a charge stored in the floating gate using Fowler-Nordheim tunneling.

Another aspect is directed to an integrated circuit comprising an array of memory cells formed on a semiconductor substrate. Each of the memory cells includes a gate dielectric formed on the substrate, a floating gate formed on the gate dielectric, an intergate dielectric formed on the floating gate and including a high-K material, and a control gate formed above the intergate dielectric. The integrated circuit further includes a programming circuit configured to perform an erase operation of one or more of the memory cells in the array by removing charge from the floating gate using Fowler-Nordheim tunneling.

Another aspect is directed to a method for changing a storage state of a non-volatile memory cell. The method includes programming the storage state of the memory cell by injecting electrons into a floating gate of the memory cell and erasing the storage state of the memory cell by removing electrons from the floating gate using Fowler-Nordheim tunneling. The memory cell is a SONOS-type memory cell having a high-K dielectric layer disposed between the floating gate and a control gate.

BRIEF DESCRIPTION OF THE DRAWINGS

Reference is made to the attached drawings, wherein elements having the same reference number designation may represent like elements throughout. In the drawings.

DETAILED DESCRIPTION

The following detailed description of the invention refers to the accompanying drawings. Also, the following detailed description does not limit the invention. Instead, the scope of the invention is defined by the appended claims and equivalents.

Techniques described below relate to a semiconductor memory device, a method of using the semiconductor memory device, and a method of making the semiconductor memory device. The semiconductor memory device may include an intergate dielectric layer of a high-K dielectric material interposed between the floating gate and the control gate. With this intergate high-K dielectric in place, the memory device may be programmed with hot electron injection and erased using Fowler-Nordheim tunneling. Although generally described herein as a single layer, it should be understood by those skilled in the art that the intergate dielectric layer of high-K dielectric material may be one or more layers of the same or different dielectric materials, potentially including a combination of high-K dielectric materials and oxide layers.

Figure 1:
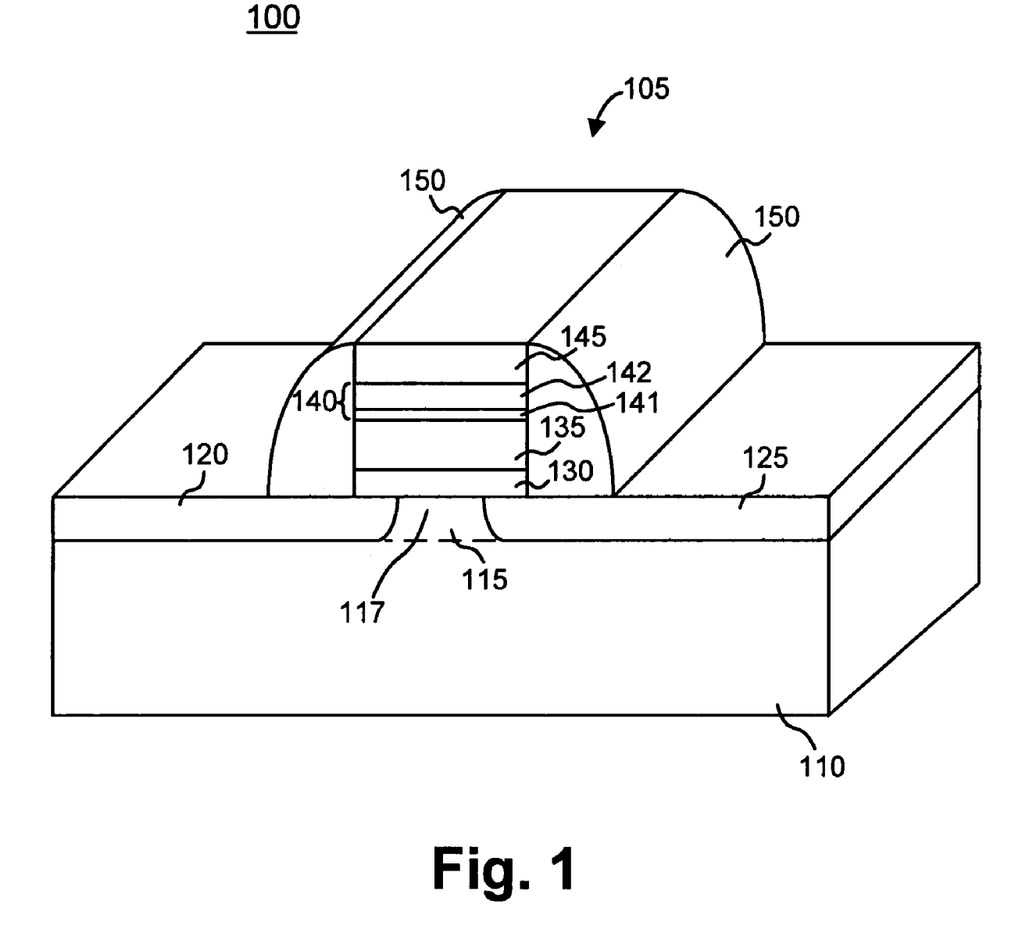
FIG. 1 is a perspective view of a semiconductor device consistent with aspects of the invention.

FIG. 1 is a perspective view of a semiconductor device 100 consistent with aspects of the invention. Device 100 may generally be a SONOS type memory cell having a vertical stack structure 105. Device 100 is illustrated as a single memory cell. In practice, device 100 will typically be implemented in an array of a large number of memory cells placed on a single integrated circuit.

Device 100 may include a semiconductor substrate 110 having an active region 115. A source 120 and a drain 125 are formed in the active region 115. A gate dielectric 130 is formed on the semiconductor substrate 110. A floating gate 135 is formed on the gate dielectric 130. The floating gate may be electrically isolated from other components in device 100. An intergate dielectric layer 140 is formed on the floating gate 135. Intergate dielectric layer 140 include a high-K dielectric material. In one implementation, intergate dielectric layer 140 may include a $SiO_2$ layer 141 formed under high-K dielectric material 142. A control gate 145 is formed on intergate dielectric layer 140. Gate dielectric 130, floating gate 135, intergate dielectric layer 140, and control gate 145 form vertical stack 105 of the memory cell. Spacers 150 may be formed on the sidewalls of the vertical stack. Isolation techniques that are known in the art may be used to electrically isolate the semiconductor device 100 from other semiconductor devices.

Semiconductor substrate 110 may include any conventional substrate. For example, semiconductor substrate 110 may include a bulk silicon semiconductor substrates, a silicon-on-insulator (SOI) semiconductor substrate, a silicon-on-sapphire (SOS) semiconductor substrate, or a semiconductor substrate formed of other materials known in the art. The techniques described herein are not limited to any particular type of semiconductor substrate.

Active region 115 may be a p-type region or an n-type region formed in the semiconductor substrate 110. Active region 115 may be pre-doped prior to forming stack 105. Active region 115 may be doped with p-type dopings for n-type channel devices and/or n-type dopants for p-type channel devices.

Source 120 and drain 125 may be two N+ regions formed in the active region 115 of the semiconductor substrate 110. Alternatively, source 120 and the drain 125 may be two P+ regions. Source 120 and drain 125 may be deep or shallow implant regions.

Gate dielectric 130 is shown as a single layer dielectric. Gate dielectric 130 may be made of suitable gate oxide dielectric materials, such as $SiO_2$. Gate dielectric 130 may have a thickness of, for example, between 30 and 80 Å.

It should be understood by those skilled in the art that the gate dielectric 130 could be a multi-layer dielectric. For example, a layer of $SiO_2$ may be deposited on the semiconductor substrate 110 followed by another dielectric.

Floating gate 135 may be made of typical, well-known gate electrode materials. For example, for SONOS-type memory cells, nitride may be used. The exemplary floating gate 135 may have a thickness of between about 30 and 150 Å for SONOS.

Channel 117, formed in active region 115, may be a p-type region interposed between source 120 and drain 125. Alternatively, an n-type channel could be interposed between two P+ regions.

Intergate dielectric layer 140 is disposed on floating gate 135. Consistent with aspects of the invention, intergate dielectric layer 140 includes a layer 142 of a high-K dielectric material. For example, layer 142 may include aluminum oxide (e.g., $Al_2O_3$) or another high-K dielectric material described below. Layer 142 may have a thickness of between about 70 and 250 Å, for example. Layer 142 may be deposited by atomic layer deposition (ALD) techniques or other conventional techniques.

Control gate 145 may be positioned on top of intergate dielectric layer 140. Control gate 145 may be made of typical, well-known gate electrode materials, such as, example, polysilicon. Exemplary control gate 145 may have a thickness of between about 500 and 3000 Å.

Spacers 150 may be made of a dielectric material. The dielectric material may be $Si_xN_y$, $SiO_xN_y$, $Al_2O_3$, or another high-K dielectric material described below. Further, spacers 150 are shown as single layer spacers. However, spacers 150 could be multi-layer spacers.

Not shown in FIG. 1 are additional structures of a final semiconductor device, such as various conductive layers, interlayer dielectrics, contacts, protective coatings and other parts of the structure which would be included in a complete, working semiconductor device. These additional structures are not shown or described for simplicity and brevity. Nevertheless, how such structures could be formed will be easily understood by those of skill in the art.

As used herein, the term "high-K dielectric" refers to a dielectric material having a dielectric constant (K) greater than $SiO_2$ (K=3.9). Such high-K dielectric materials include, for example, silicon oxynitride, which has a K of about 4 to about 8 depending on the relative content of oxygen and nitrogen; silicon nitride, which has a K of about 6 to about 9; $Al_2O_3$, which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others. It is understood that the present invention is not limited to the specific dielectric materials disclosed herein, but may include any appropriate high-K dielectric materials which are known and are compatible with the remaining elements of the semiconductor device with which the dielectric materials are to be used.

It is noted that the K-values, or relative permittivity, for high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material. As used herein, when a material is referred to by a specific chemical name or formula, the material may include non-stoichiometric variations of the stoichiometrically exact formula identified by the chemical name.

Figure 2:
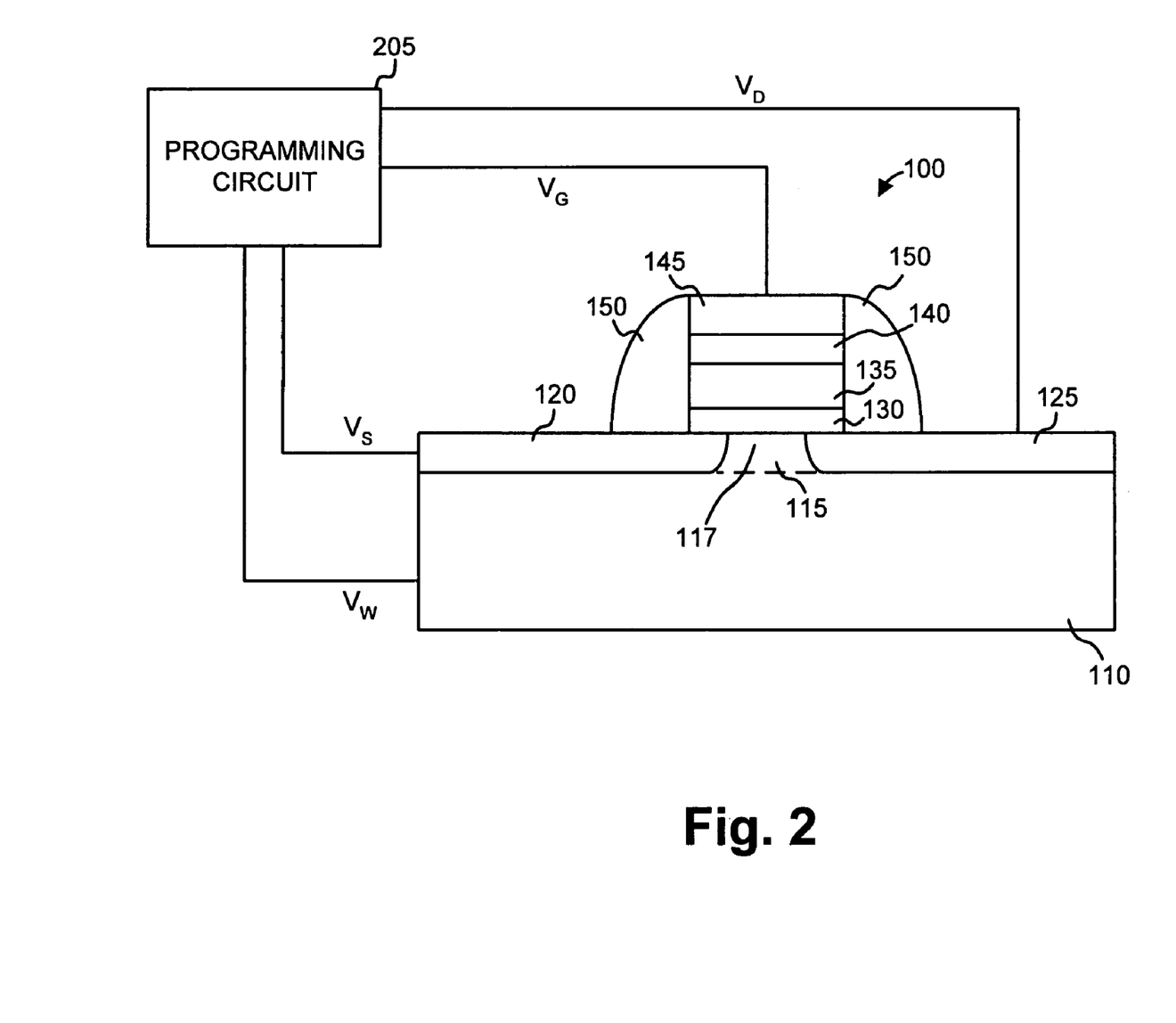
FIG. 2 is a front view of the semiconductor device shown in FIG. 1.

FIG. 2 is a front view of semiconductor device 100. A programming circuit 205 is additionally shown in FIG. 2. Programming circuit 205 may be used to program/erase semiconductor device 100. For instance, for a program operation, programming circuit 205 may inject electrons into floating gate 135. The injected electrons become trapped in floating gate 135 and cause the threshold voltage of device 100 to increase. When in this state, device 100 can be interpreted to be at a first logical state (e.g., logic 1 or high). To erase the state of device 100, programming circuit 205 may perform Fowler-Nordheim (FN) tunneling to inject holes into floating gate 135 that cancel the previously injected electrons or to cause electrons to tunnel out of floating gate 135. The threshold voltage of device 100 will then decrease. When in this state, device 100 can be interpreted to be at a second logical state (e.g., logic 0 or low).

As shown in FIG. 2, programming circuit 205 may be electrically connected to memory device 100 via four control lines: drain line $V_D$, gate line $V_G$, source line $V_S$, and well line $V_W$. Well line $V_W$ may connect to the well or body of the semiconductor substrate 110.

Figure 3:
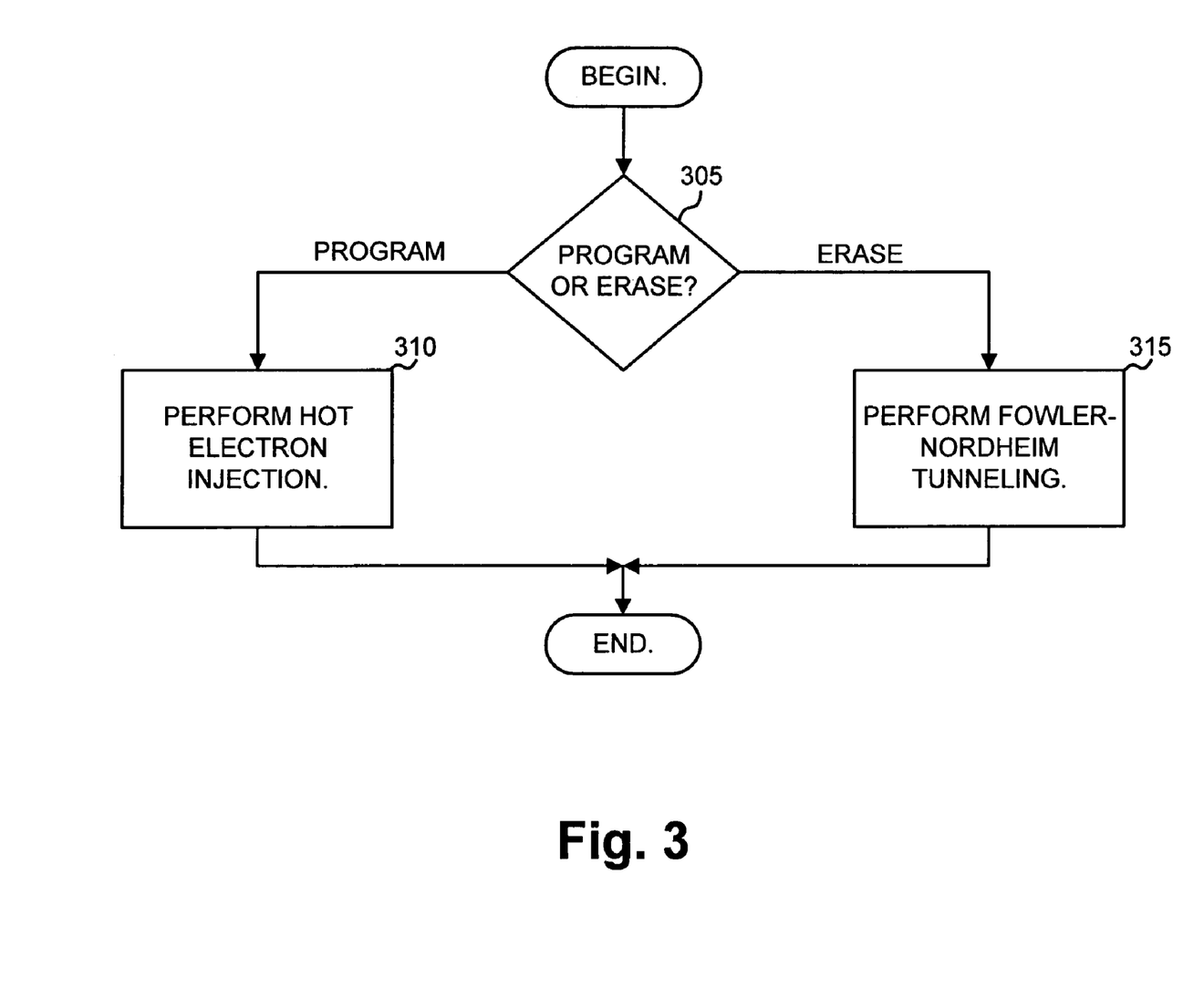
FIG. 3 is a flow chart illustrating operations performed by the programming circuit shown in FIG. 2.

FIG. 3 is a flow chart illustrating operations performed by programming circuit 205 in additional detail. It may first be determined whether a program (i.e., a "write") or erase operation is being requested (act 305). In the case of a program operation, this operation may be performed by hot electron injection (act 310). Hot electron injection is a known technique for programming SONOS memory cells. In alternate implementations, other programming techniques may be used to inject charge into floating gate 135. In hot electron injection, programming circuit may apply appropriate voltage potentials to $V_D$, $V_G$, and $V_S$. The applied potentials generate a vertical electric field through stack structure 105 and a lateral electric field along the length of channel 117 from source 120 to drain 125. The lateral electric field causes electrons to be drawn off source 120 and begin accelerating towards drain 125. As the electrons move along the length of the channel 117, the electrons gain energy and upon attaining enough energy, the electrons jump over the potential barrier of the gate dielectric 130 and into the floating gate 135, where the electrons become trapped.

In the case of an erase operation, programming circuit 205 may use Fowler-Nordheim tunneling to remove charge from floating gate 135 (acts 305 and 315). In FN tunneling, programming circuit 205 may apply a negative voltage to $V_G$ and a positive voltage to $V_D$, $V_S$, and $V_W$. This causes a bias from active region 115 to floating gate 135 across gate dielectric 130 sufficient to cause FN tunneling so that electrons are removed from floating gate 135. Removing electrons from floating gate 135 decreases the threshold voltage of device 100.

The FN tunneling operation is made possible due to high-K intergate dielectric layer 140. Without the high-K intergate dielectric layer 140 (i.e., using just a conventional oxide layer), an FN tunneling erase may tend to cause back gate injection. In back gate injection, electrons moving from floating gate 135 to channel 117 cause an increasing bias across intergate dielectric 140, which may, when a non-high-K dielectric is used for the intergate dielectric, eventually cause tunneling of electrons from control gate 145 to floating gate 135. The electrons that tunnel from control gate 145 to floating gate 135 due to back gate injection will offset (saturate) the electrons that are being effectively removed from floating gate 135 due to FN tunneling. This "saturation problem" in conventional SONOS memory cells can make it difficult to effectively erase the cell using FN tunneling. Accordingly, conventional SONOS memory cells typically use HHI to perform an erase operation. Using HHI in SONOS memory cells for erase operations, as previously mentioned, however, can tend to damage gate dielectric layer 130.

For clarity, the acts in FIG. 3 corresponding to the program and erase operation are shown simply as single acts 310 and 315. In practice, programming circuit 205 may, as is known in the art, perform other operations in accomplishing these acts. For example, in performing either or both of acts 310 and 315, programming circuit 205 may, after programming or erasing a memory cell, verify that the program or erase operation was successful. If not successful, programming circuit may re-perform the HHI (program) or FN tunneling (erase) operation in order to add or remove, respectively, additional electrons from floating gate 135.

Method of Manufacture

Figure 4:
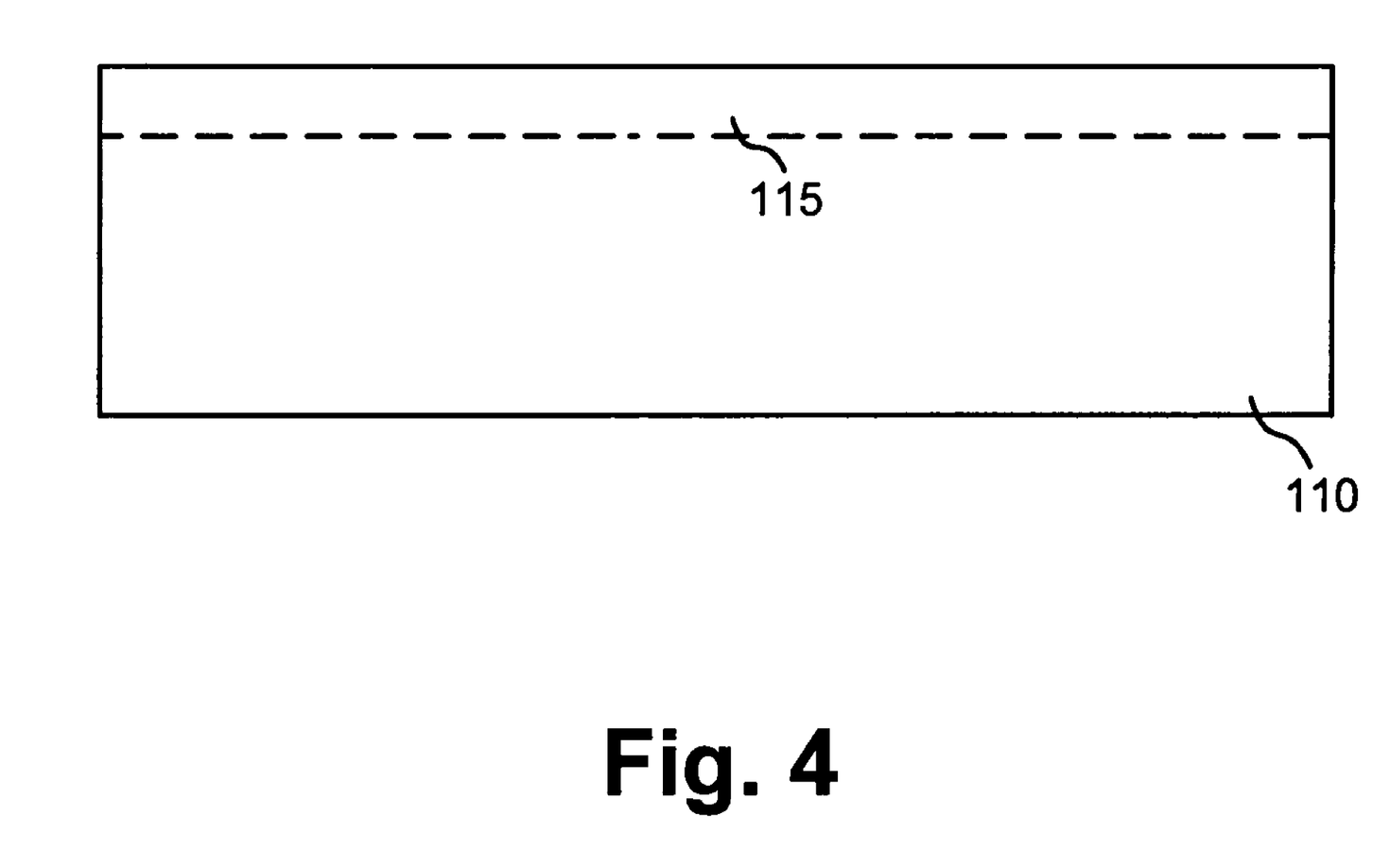
FIGS. 4-9 are diagrams illustrating an exemplary method of manufacturing the device shown in FIG. 1.

FIGS. 4-9 are diagrams illustrating an exemplary method of manufacturing device 100. To begin, as shown in FIG. 4, semiconductor substrate 110 is provided. Semiconductor substrate 110 may be any appropriately selected semiconductor substrate known in the art. Semiconductor substrate 110 may be subjected to implants to provide the active region 115 in semiconductor substrate 110 as is known in the art. For instance, boron or indium may be implanted to form a p-type region or channel for an n-type device and phosphorous or arsenic may be implanted to form an n-type region or channel for a p-type device.

Figure 5:
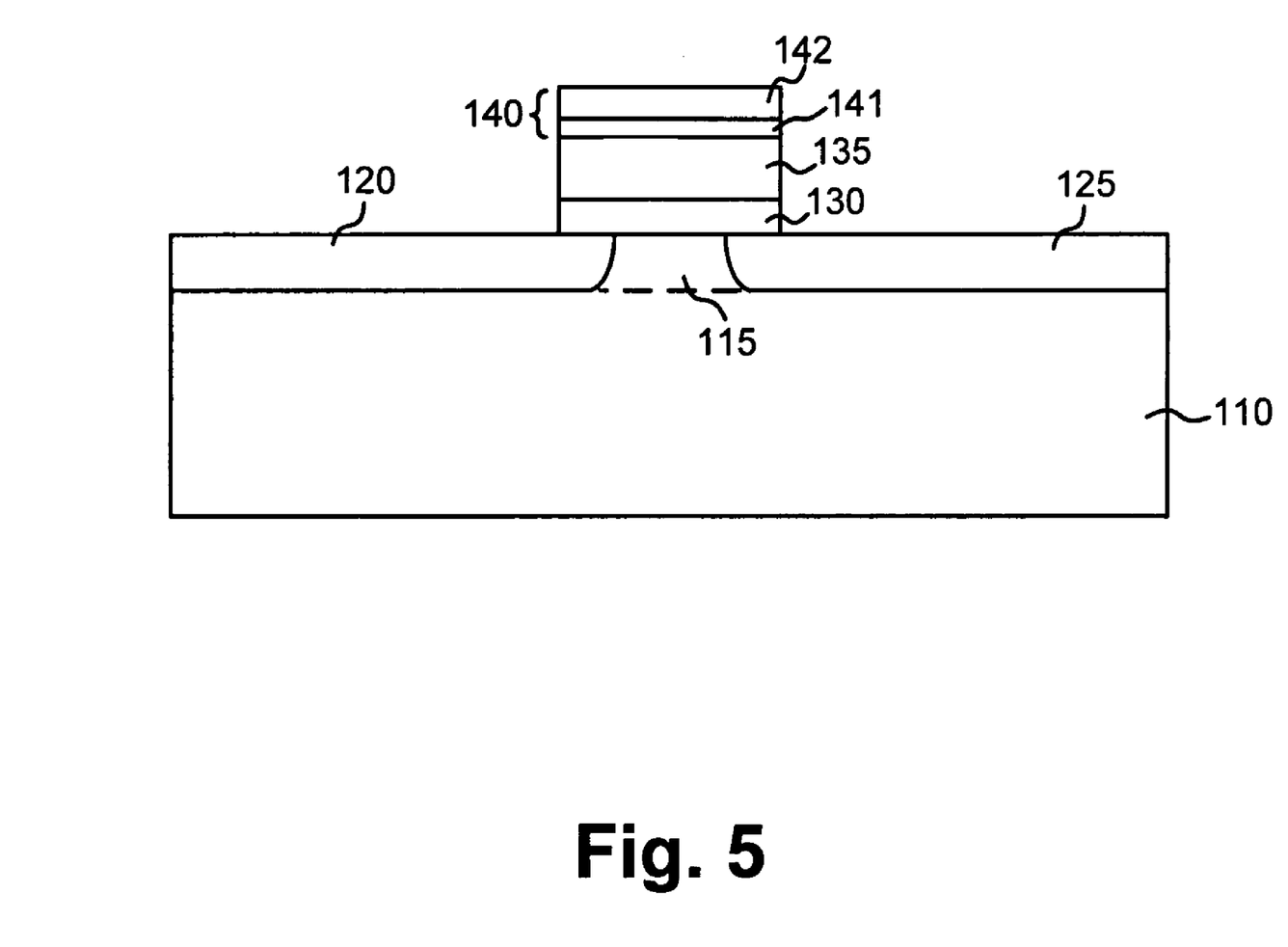

Now referring to FIG. 5, gate dielectric 130 of $SiO_2$ may be formed on the semiconductor substrate 110. Gate dielectric 130 may be thermally grown or deposited to a thickness between 30 and 80 angstroms. Floating gate 135 may be formed on gate dielectric 130. Floating gate 135 may be formed as a nitride layer and may be deposited to a thickness between about 30 and 150 Å. Alternatively, floating gate 135 may be formed as a layer other than a nitride layer, such as SiRN, other Hi-K materials, or another material capable of holding charge. An intergate dielectric layer 140 may next be formed on top of floating gate 135. Intergate dielectric layer 140 may include a $SiO_2$ layer 141 grown to a thickness between about 30 and 150 Å0 and a Hi-K material 142 deposited on top of layer 141. Hi-K layer 142 may be formed from a number of materials, as described above. In an exemplary embodiment, Hi-K layer 142 is of $Al_2O_3$.

Figure 6:
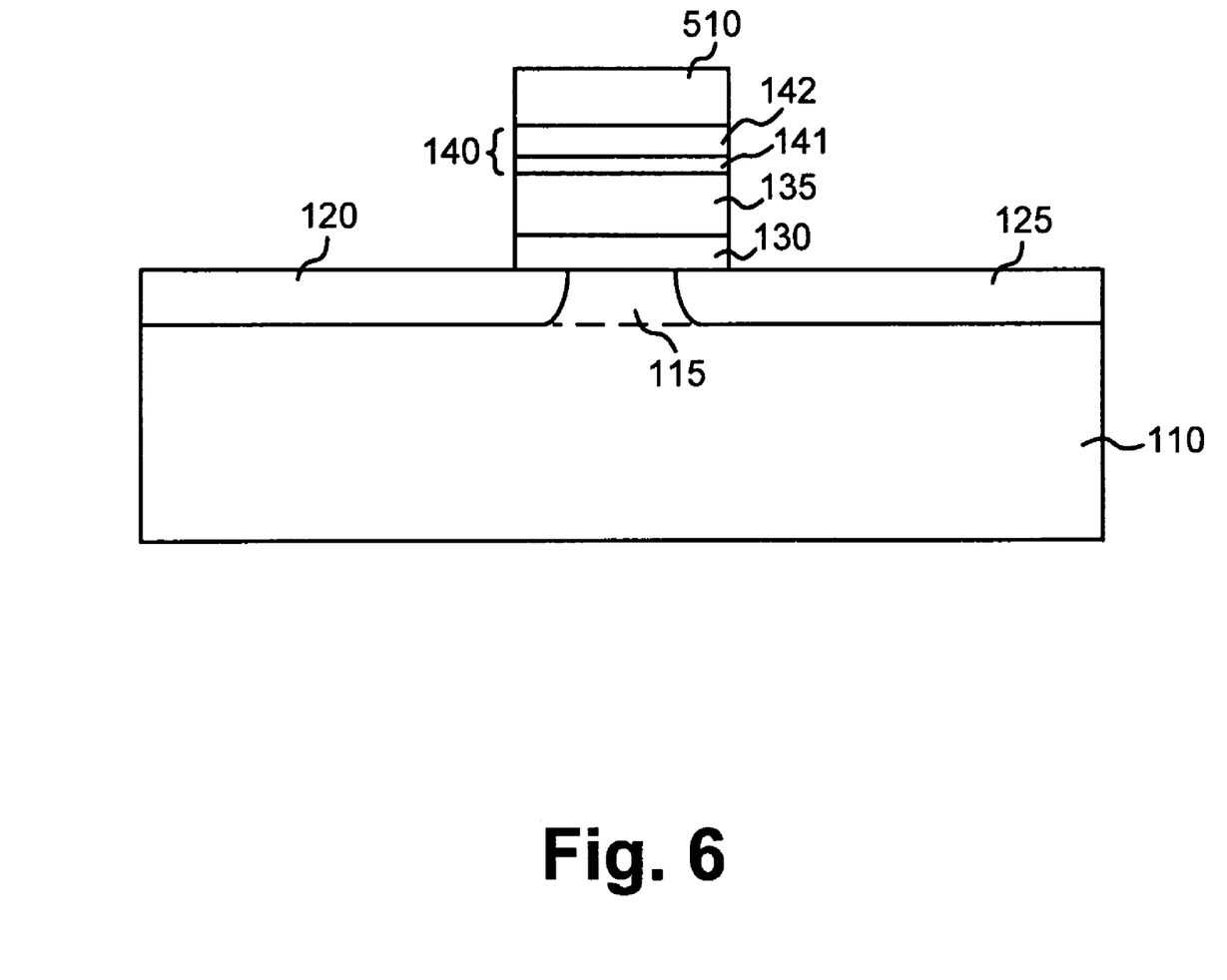

Referring to FIG. 6, a protective layer 510 may be formed on intergate dielectric layer 140. Protective layer 510 may be formed in order to protect intergate dielectric layer 140 from, for example, boron penetration, during an implant to form source region 120 and drain region 125.

The semiconductor substrate 110 may next be subjected to implants to produce source region 120 and drain region 125. Source region 120 and drain region 125 may be formed by a main perpendicular implant. The main perpendicular implant is a relatively high energy, high concentration implant which is capable of producing source 120 and the drain 125. Either boron, arsenic, or phosphorous may be used alone or in any combination as the dopant atoms.

Although source region 120 and drain region 125 are shown as single implantation regions, it should be understood that extension implantation may be done in order to form extension regions as is known in the art. It should also be understood that the formation of source region 120 and drain region 125 may take place before the formation of the floating gate 135 or after the formation of vertical stack 105.

Protective layer 510 may next be etched down to intergate dielectric layer 140. Thus, protective layer 510 may be removed to leave an upper surface of intergate dielectric layer 140 exposed. It should be appreciated that any suitable selective etching methods well-known in the art may be used.

Figure 7:
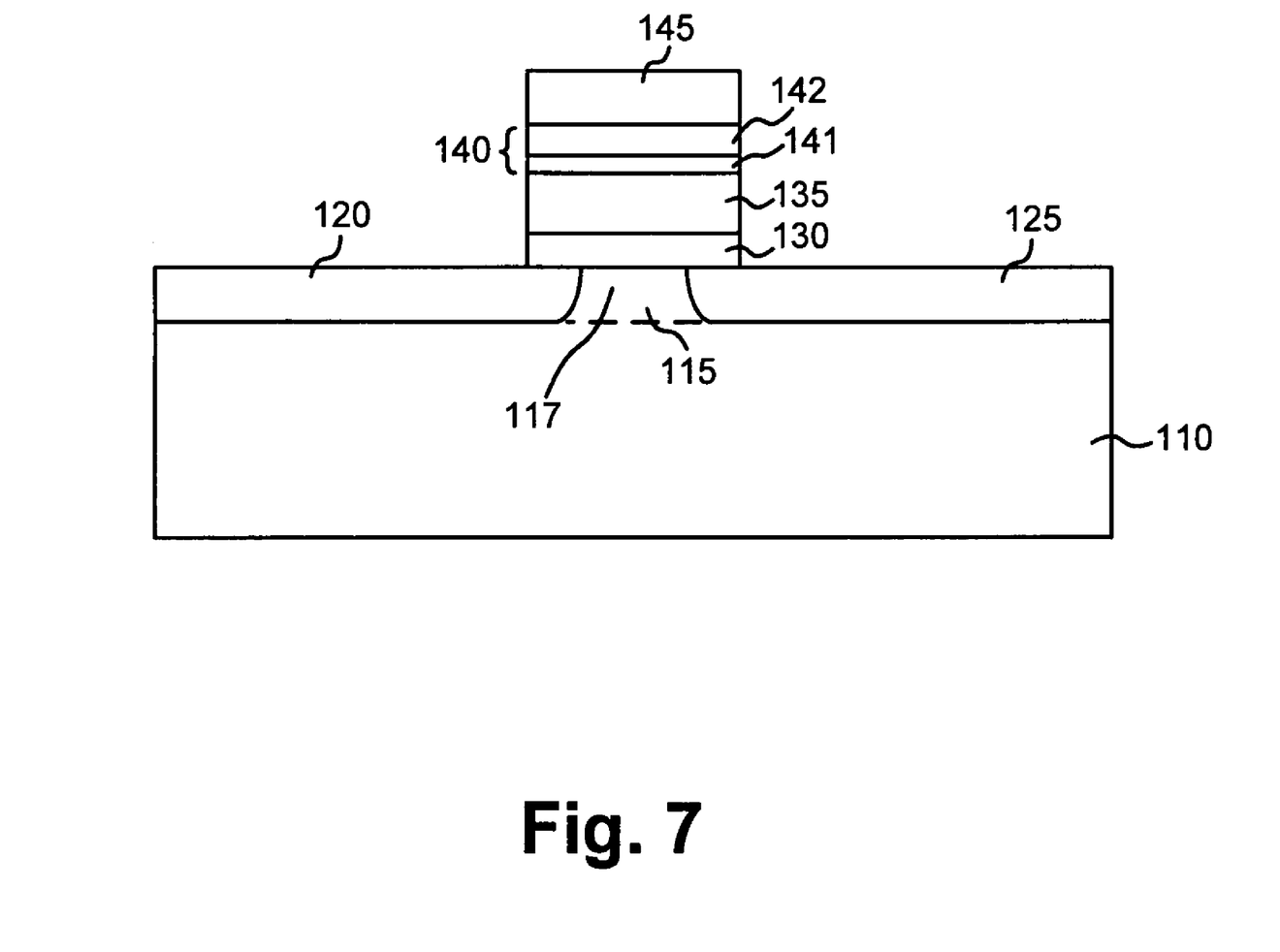

Referring to FIG. 7, an undoped polysilicon layer 145 may be deposited and patterned on the intergate dielectric layer 140. The polysilicon may then be doped using an implantation step to implant the polysilicon. Alternatively, layer 145 may be pre-doped.

Figure 8:
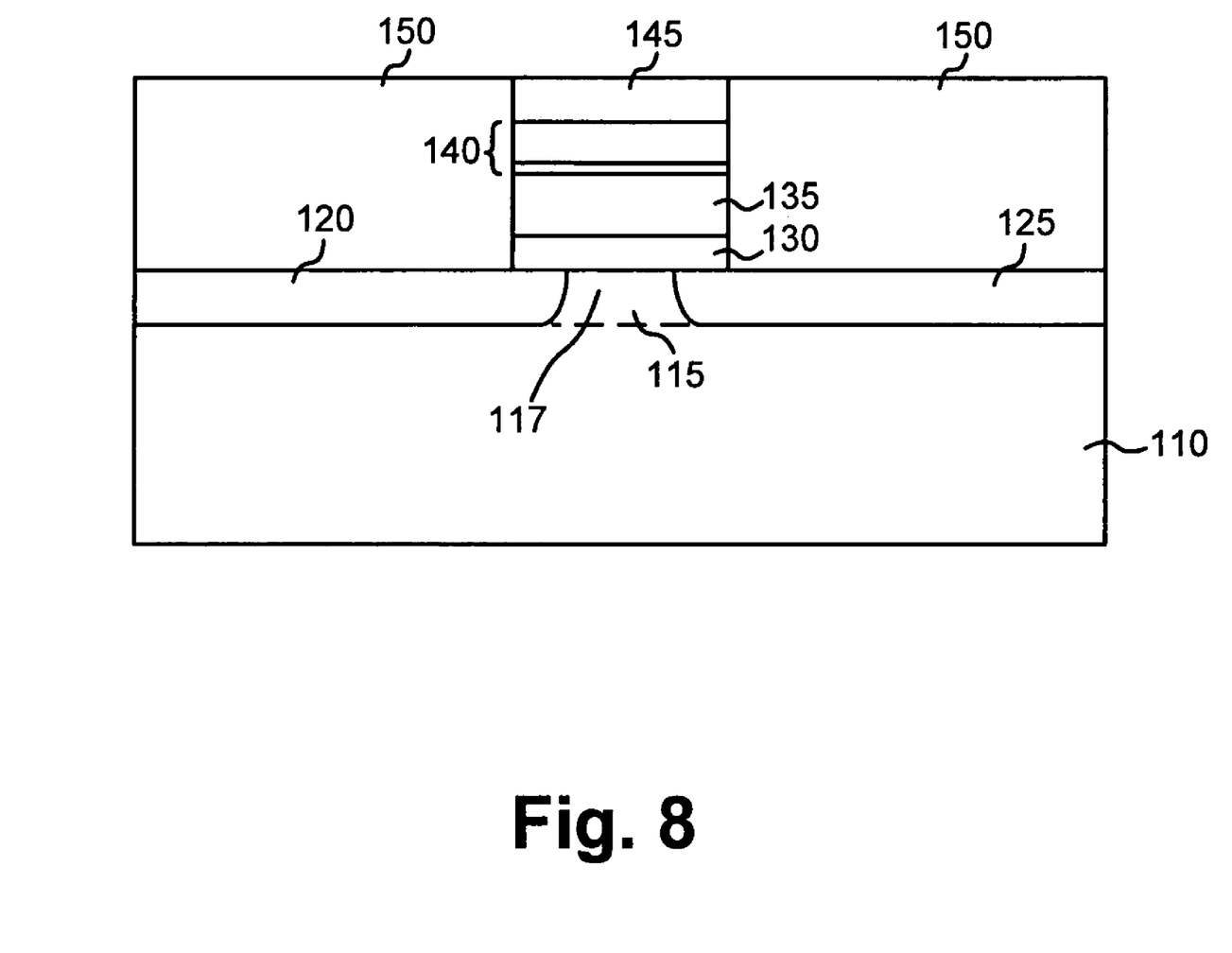
Figure 9:
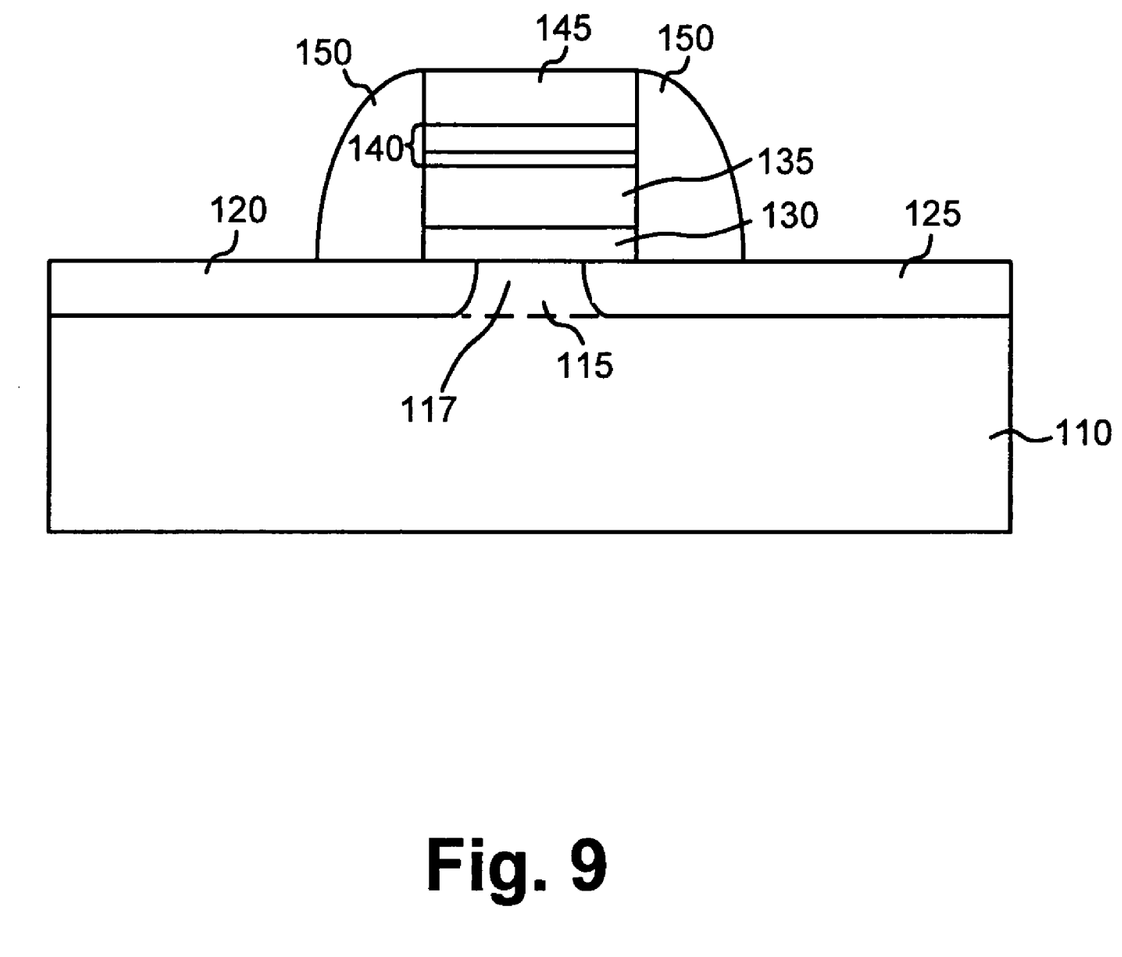

Next, referring to FIG. 8, a spacer layer 150 may be deposited on the semiconductor substrate 110. Spacer layer 150 may be polished back to the top surface of polysilicon layer 145. The polishing may be done using conventional techniques, which are well-known in the art. The spacer layer 150 may be a TEOS layer or other spacer material known to those skilled in the art.

Subsequently, connections such as word lines may be formed using conventional techniques in order to establish electrical connections between the semiconductor device 100 and other nodes (such as programming circuit 205). The formation of the connections are not shown.

Spacer layer 150 may be additionally anisotropically etched with a suitable etchant. The spacer layer 150 is etched down to expose the top of the control gate 145 and the lateral surface of the semiconductor substrate I 10, leaving the spacers 150 shown in FIG. 9.

Exemplary System

Figure 10:
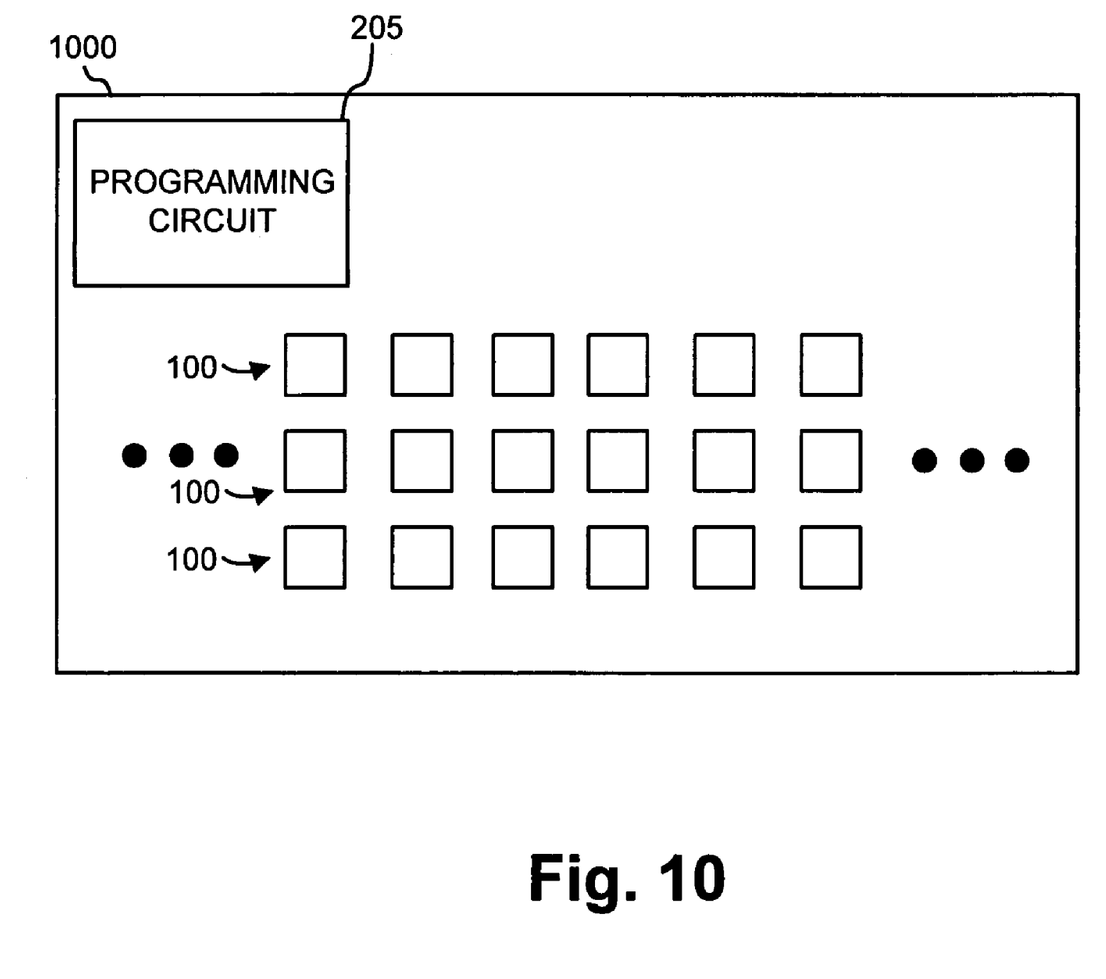
FIG. 10 is a diagram illustrating a system of semiconductor devices, such as those shown in FIG. 1, implemented on a single integrated circuit.

FIG. 10 is a diagram illustrating a system of semiconductor devices 100 implemented on a single integrated circuit 1000. Semiconductor devices 100 may each be SONOS-type memory cells. Integrated circuit 1000 may contain many thousands or millions of semiconductor devices 100 (i.e., memory cells) arranged as one or more memory arrays. Semiconductor devices 100 may be programmed/erased by programming circuit 205, as previously described.

CONCLUSION

Although particular embodiments of the invention have been described in detail, it is understood that the invention is not limited correspondingly in scope, but includes all changes, modifications and equivalents coming within the spirit and terms of the claims appended hereto. Additionally, although the flowchart of FIG. 3 shows a specific order of execution, it is understood that the order of execution may differ from that which is depicted. Also, two or more blocks shown in succession in FIG. 3 may be executed concurrently or with partial concurrence.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device comprising:
a gate dielectric formed on a substrate;
a floating gate formed on the gate dielectric, the floating gate comprising a nitride material;
an intergate dielectric formed on the floating gate and including a first layer including a high-K material and a second layer of silicon dioxide formed under the first layer;
a control gate formed directly on the high-K material of the intergate dielectric; and
a programming circuit configured to erase a charge stored in the floating gate using Fowler-Nordheim tunneling, wherein performing the Fowler-Nordheim tunneling includes applying a negative voltage to the control gate and a positive voltage to the source area and the drain area.

2. The memory device of claim 1, wherein the high-K material comprises at least one of silicon oxynitride, aluminum oxide, hafnium silicate, hafnium silicon oxynitride, hafnium silicon nitride, $HfO_2$, $ZrO_2$, or $Ta_2O_5$.

3. The memory device of claim 1, wherein the high-K material has a K value greater than that of silicon dioxide.

4. The memory device of claim 1, wherein the programming circuit is further configured to store charge in the floating gate using hot electron injection through the gate dielectric formed on the substrate.

5. The memory device of claim 1, further comprising:
dielectric spacers positioned adjacent the gate dielectric, the floating gate, the intergate dielectric, and the control gate.

6. The memory device of claim 1, further comprising:
a source area formed in a first active region of the substrate; and
a drain area formed in a second active region of the substrate.

7. The memory device of claim 1, wherein the memory device is a SONOS-type memory cell.

8. An integrated circuit comprising:
an array of memory cells formed on a semiconductor substrate, each of the memory cells including:
a gate dielectric formed on the substrate,
a floating gate formed on the gate dielectric and comprising a nitride layer,
an intergate dielectric formed on the floating gate, the intergate dielectric including a first layer including a high-K material and a second layer of silicon dioxide formed under the first layer, and
a control gate formed directly on the high-K material of the intergate dielectric; and
a programming circuit configured to erase one or more of the memory cells in the array using Fowler-Nordheim tunneling, and further configured to store charge in the floating gate using hot electron injection through the gate dielectric formed on the substrate.

9. The integrated circuit of claim 8, wherein the high-K material comprises at least one of silicon oxynitride, aluminum oxide, hafnium silicate, hafnium silicon oxynitride, hafnium silicon nitride, $HfO_2$, $ZrO_2$, or $Ta_2O_5$.

10. The integrated circuit of claim 8, wherein the high-K material has a K value greater than that of silicon dioxide.

* * * * *